United States Patent
Yardi et al.

(10) Patent No.: US 11,948,654 B1
(45) Date of Patent: Apr. 2, 2024

(54) DISTRIBUTED PHASED SRAM REPAIR FOR SYSTEMS ON A CHIP

(71) Applicant: Meta Platforms Technologies, LLC, Menlo Park, CA (US)

(72) Inventors: Shrirang Madhav Yardi, San Jose, CA (US); Dinesh Patil, Sunnyvale, CA (US); Neeraj Upasani, Sammamish, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 27 days.

(21) Appl. No.: 17/662,178

(22) Filed: May 5, 2022

Related U.S. Application Data

(60) Provisional application No. 63/201,632, filed on May 6, 2021.

(51) Int. Cl.
  *G11C 29/44* (2006.01)
  *G11C 29/12* (2006.01)
  *G11C 29/36* (2006.01)
  *G11C 29/46* (2006.01)

(52) U.S. Cl.
  CPC .... *G11C 29/4401* (2013.01); *G11C 29/12005* (2013.01); *G11C 29/36* (2013.01); *G11C 29/46* (2013.01)

(58) Field of Classification Search
  CPC .......... G11C 29/4401; G11C 29/12005; G11C 29/36; G11C 29/46
  See application file for complete search history.

(56) References Cited

U.S. PATENT DOCUMENTS

| | | | | |
|---|---|---|---|---|
| 7,304,901 | B2 * | 12/2007 | Ouellette | G11C 29/44 |
| | | | | 365/201 |
| 11,467,675 | B1 * | 10/2022 | Hooker | G06F 3/0346 |

OTHER PUBLICATIONS

Reeja J., et al., "Design of Built-in Self-Test Core for SRAM," International Journal of Engineering Research & Technology (IJERT), 2014, vol. 3, No. 3, 5 pages.

Sharma A., "Built in Self-Test Scheme for SRAM Memories," International Conference on Advances in Computing, Communications and Informatics (ICACCI), 2016, 5 pages.

Synopsys: "Star Memory System Solution," Designware IP Datasheet, 2020, 3 pages.

* cited by examiner

*Primary Examiner* — Vanthu T Nguyen
(74) *Attorney, Agent, or Firm* — Greenberg Traurig, LLP

(57) ABSTRACT

A system on a chip includes a first subsystem comprising a first memory; a second subsystem comprising a second memory; and an always-on subsystem. The always-on subsystem can comprise processing circuitry configured to: in response to a first activation event, signal the first subsystem to initiate repair operations on the first memory, and in response to a second activation event occurring after the first event, signal the second subsystem to initiate repair operations on the second memory.

20 Claims, 10 Drawing Sheets

DISTRIBUTED PHASED SRAM REPAIR FOR SYSTEMS ON A CHIP

CROSS REFERENCE

This application claims the benefit of U.S. Provisional Patent Application No. 63/201,632, filed May 6, 2021, the entire contents of which is incorporated herein by reference.

TECHNICAL FIELD

This disclosure generally relates to Static Random-Access Memory (SRAM) repair implemented in various types of computing systems.

BACKGROUND

Many computing systems incorporate SRAM for storing executable code and data while the system is in operation. Static random-access memory uses latching circuitry to store each bit. Data stored in SRAM is lost when power is removed and is thus a form of volatile memory. One aspect of certain types of SRAM is that bit errors in the SRAM can be repaired. For example, when power is applied to such SRAM, logic tests test the SRAM to determine if any bits are exhibiting errors. Bits that exhibit errors can be replaced with bits that are reserved for use as replacement bits in a way that is transparent to the computing system. Thus, the computing system can boot and operate properly even when some of the SRAM bits exhibit errors.

Examples of computing systems that incorporate SRAM include artificial reality systems. In general, artificial reality is a form of reality that has been adjusted in some manner before presentation to a user, which may include, e.g., a virtual reality, an augmented reality, a mixed reality, a hybrid reality, or some combination and/or derivatives thereof. Artificial reality systems include one or more devices for rendering and displaying content to users. Examples of artificial reality systems may incorporate a head-mounted display (HMD) worn by a user and configured to output artificial reality content to the user. In some examples, the HMD may be coupled (e.g., wirelessly or in tethered fashion) to a peripheral device that performs one or more artificial reality-related functions.

SUMMARY

In general, this disclosure is directed to techniques for distributed and phased SRAM repair in a low power environment. A low power System-on-a-Chip (SoC) may have systems and subsystems that incorporate SRAM. SRAM can be tested to determine if any bit-errors are present. An example of such SRAM is a Self-Test and Repair (STAR) Memory System (referred to as "SMS"). In some cases, a Memory Built-In Self-Test (MBIST) is present on the SRAM to perform the testing and correction. An on-chip SMS server can determine from the test results which bits, if any, exhibit errors. Redundant bits, referred to as repair bits, can be used in place of failed bits detected during the MBIST. The SMS server can store, in One-Time Programmable (OTP) Read-Only Memory (ROM), mappings of repair bits to corresponding failed bits. At boot of the SoC, the SMS server can set retention flops (also referred to as repair flops) representing the repair bits according to the mappings.

Typically, when power is applied to an SoC, power is also applied to all of the subsystems of the SoC, and retention flops are set. The retention flops maintain their state as long as power is supplied to the chip. However, maintaining power to the SoC can be expensive and wasteful when it is desirable to maintain a battery charge for a long period of time. As an example, a video subsystem on an SoC may have SRAM that includes repair bits. Even though the video subsystem may be unused much of the time, battery charge may be wasted by maintaining power to the SMS server and other memory components on the video subsystem such as an SMS wrapper, and SMS processors in order to maintain the retention flop state.

The techniques described herein may be implemented on an SoC that has multiple subsystems for performing various functions of the system. Examples of such subsystems include system control subsystems, communications subsystems, security subsystems, video processing subsystems, etc. Some of the subsystems may not need to be powered on at all times. For example, as discussed above, a video subsystem need not be powered on if a camera on the system is not in use.

In typical systems, when power is applied to an SoC, power is also applied to all of the subsystems of the SoC, and repair bits are determined for the SRAMs of each subsystem at that time. One aspect of the techniques disclosed herein is that repair bits may be set on-demand (e.g., in response to a subsystem activation). For example, when the SoC is booted, power may be applied to a minimal subset of the subsystems of the SoC that may be required for effective operation of the SoC. Subsystems other than the minimal subset of subsystems may remain in a powered-down state until the particular subsystem is needed. At a later point in time, for example, in response to an activation event, power can be applied to the subsystem and the SMS server can set repair bits for the memory of the activated subsystem as needed. Thus, the SoC can repair SRAM during different phases of the operation of the SRAM. For example, a first phase may be when the SoC is booted or reset, and subsequent phases may be determined as various subsystems are activated as needed.

Another aspect of the techniques disclosed herein is that SRAM repair can be distributed across the various subsystems of the SoC. For example, a first portion of SRAM may be repaired by a first subsystem and a second portion of SRAM may be repaired by another subsystem. The repair of the SRAM may take place in parallel or may take place in phases as noted above.

A further aspect of the techniques disclosed herein is that the system may maintain power to retention flops for repair bits for the SRAM of a subsystem while other components of the subsystem remain in a powered-down state. While there may be a power cost for maintaining power for repair bits, this cost can be much lower than the power costs associated with maintaining power for the entire subsystem.

The SoC power management techniques of this disclosure provide several technical improvements. SoCs implementing the techniques described herein can use less power than typical SoCs, resulting in improved battery usage and battery life, while maintaining the ability to repair bit-errors in the SRAM of the SoC and its subsystems. A practical application of the techniques is an SoC that can be used in a low-power environment. For example, components of an artificial reality system (e.g., a head mounted device, handheld controller etc.) can incorporate SoCs that implement the techniques of this disclosure to improve the battery life of the components. The improved battery life can improve customer satisfaction with the system and improve efficiencies of the system.

In one example, this disclosure describes an SoC that includes a first subsystem comprising a first memory; a second subsystem comprising a second memory; and an always-on subsystem, the always-on subsystem comprising processing circuitry configured to: in response to a first activation event, signal the first subsystem to initiate repair operations on the first memory, and in response to a second activation event occurring after the first event, signal the second subsystem to initiate repair operations on the second memory.

In another example, this disclosure describes an artificial reality system that includes a head mounted display (HMD) configured to output artificial reality content, the HMD including at least one SoC, wherein the at least one SoC comprises: a first subsystem comprising a first memory; a second subsystem comprising a second memory; and an always-on subsystem, the always-on subsystem comprising processing circuitry configured to: in response to a first activation event, signal the first subsystem to initiate repair operations on the first memory, and in response to a second activation event occurring after the first event, signal the second subsystem to initiate repair operations on the second memory.

In another example, this disclosure describes a method repairing memory on an SoC having a plurality of subsystems includes in response to a first activation event, signaling, by an always-on subsystem of the plurality of subsystems, a first subsystem of the plurality of subsystems to initiate repair operations on a first memory; and in response to a second activation event occurring after the first event, signaling, by the always-on subsystem, a second subsystem of the plurality of subsystems to initiate repair operations on a second memory.

The details of one or more examples of the techniques of this disclosure are set forth in the accompanying drawings and the description below. Other features, objects, and advantages of the techniques will be apparent from the description and drawings, and from the claims.

DETAILED DESCRIPTION

Figure 1:
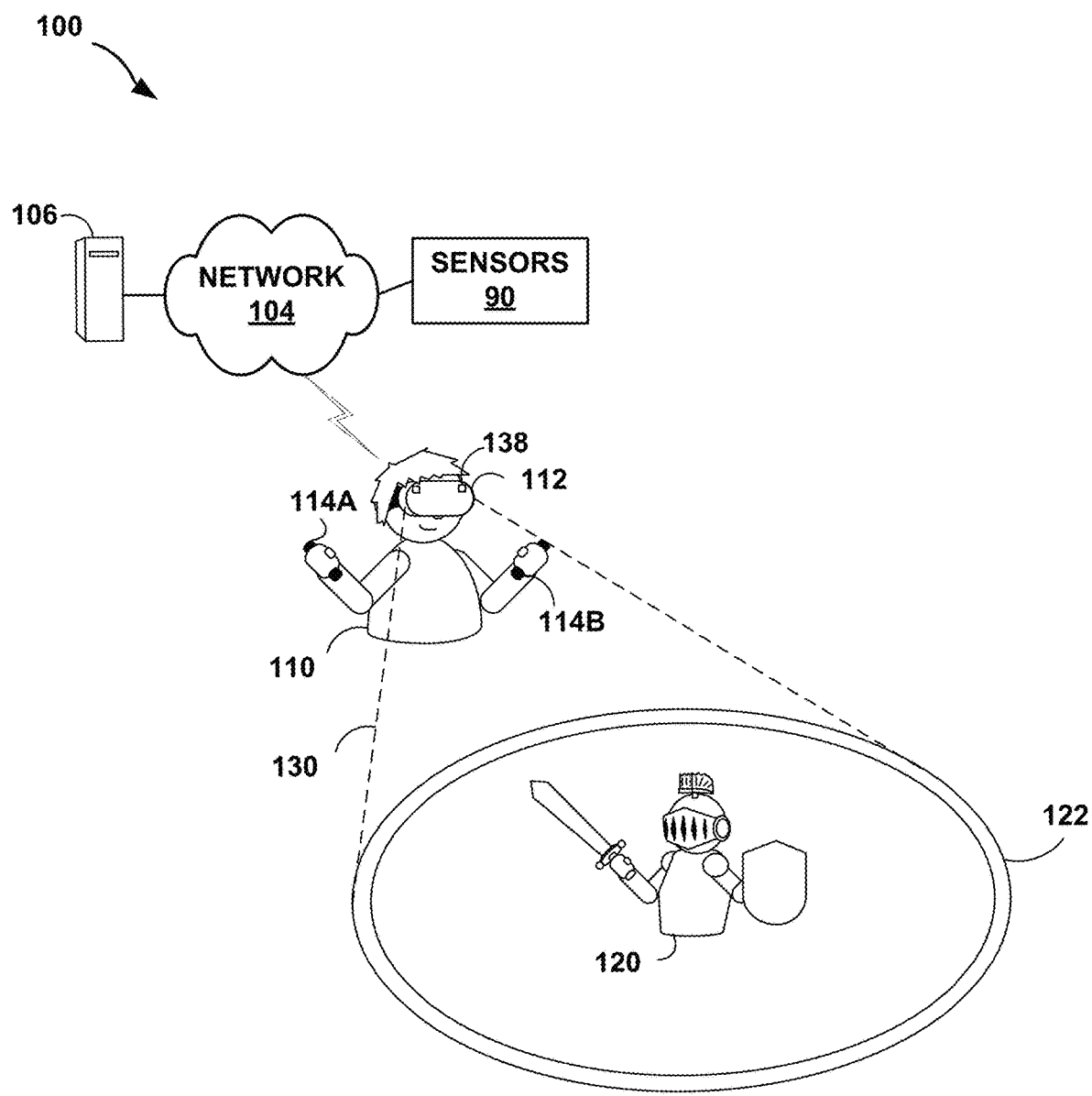
FIG. 1 is an illustration depicting an example artificial reality system that includes an SoC configured to implement distributed phased SRAM repair, in accordance with techniques described in this disclosure.

FIG. 1 is an illustration depicting an example artificial reality system that includes an SoC configured to implement distributed phased SRAM repair, in accordance with techniques described in this disclosure. The artificial reality system may be a virtual reality system, an augmented reality system, or a mixed reality system. In the example of FIG. 1, artificial reality system 100 includes a head mounted display (HMD) 112, one or more controllers 114A and 114B (collectively, "controller(s) 114"), and may in some examples include one or more external sensors 90 and/or a console 106.

HMD 112 is typically worn by user 110 and includes an electronic display and optical assembly for presenting artificial reality content 122 to user 110. In addition, HMD 112 includes one or more sensors (e.g., accelerometers) for tracking motion of the HMD 112 and may include one or more image capture devices 138 (e.g., cameras, line scanners) for capturing image data of the surrounding physical environment. Although illustrated as a head-mounted display, AR system 100 may alternatively, or additionally, include glasses or other display devices for presenting artificial reality content 122 to user 110.

Each of controller(s) 114 is an input device that user 110 may use to provide input to console 106, HMD 112, or another component of AR system 100. Controller 114 may include one or more presence-sensitive surfaces for detecting user inputs by detecting a presence of one or more objects (e.g., fingers, stylus) touching or hovering over locations of the presence-sensitive surface. In some examples, controller(s) 114 may include an output display, which may be a presence-sensitive display. In some examples, controller(s) 114 may be a smartphone, tablet computer, personal data assistant (PDA), or other hand-held device. In some examples, controller(s) 114 may be a smartwatch, smartring, or other wearable device. Controller(s) 114 may also be part of a kiosk or other stationary or mobile system. Alternatively, or additionally, controller(s) 114 may include other user input mechanisms, such as one or more buttons, triggers, joysticks, D-pads, or the like, to enable a user to interact with and/or control aspects of the artificial reality content 122 presented to user 110 by AR system 100.

In this example, console 106 is shown as a single computing device, such as a gaming console, workstation, a desktop computer, or a laptop. In other examples, console 106 may be distributed across a plurality of computing devices, such as a distributed computing network, a data center, or a cloud computing system. Console 106, HMD 112, and sensors 90 may, as shown in this example, be communicatively coupled via network 104, which may be a wired or wireless network, such as Wi-Fi, a mesh network or a short-range wireless communication medium, or combination thereof. Although HMD 112 is shown in this example as being in communication with, e.g., tethered to or in wireless communication with, console 106, in some implementations HMD 112 operates as a stand-alone, mobile AR system, and AR system 100 may omit console 106.

In general, AR system 100 renders artificial reality content 122 for display to user 110 at HMD 112. In the example of FIG. 1, a user 110 views the artificial reality content 122 constructed and rendered by an artificial reality application executing on HMD 112 and/or console 106. In some examples, the artificial reality content 122 may be fully artificial, i.e., images not related to the environment in which user 110 is located. In some examples, artificial reality content 122 may comprise a mixture of real-world imagery (e.g., a hand of user 110, controller(s) 114, other environmental objects near user 110) and virtual objects 120 to produce mixed reality and/or augmented reality. In some examples, virtual content items may be mapped (e.g., pinned, locked, placed) to a particular position within artificial reality content 122, e.g., relative to real-world imagery. A position for a virtual content item may be fixed, as relative to one of a wall or the earth, for instance. A position for a virtual content item may be variable, as relative to controller (s) 114 or a user, for instance. In some examples, the particular position of a virtual content item within artificial reality content 122 is associated with a position within the real-world, physical environment (e.g., on a surface of a physical object).

During operation, the artificial reality application constructs artificial reality content 122 for display to user 110 by tracking and computing pose information for a frame of reference, typically a viewing perspective of HMD 112. Using HMD 112 as a frame of reference, and based on a current field of view as determined by a current estimated pose of HMD 112, the artificial reality application renders 3D artificial reality content which, in some examples, may be overlaid, at least in part, upon the real-world, 3D physical environment of user 110. During this process, the artificial reality application uses sensed data received from HMD 112 and/or controllers 114, such as movement information and user commands, and, in some examples, data from any external sensors 90, such as external cameras, to capture 3D information within the real world, physical environment, such as motion by user 110 and/or feature tracking information with respect to user 110. Based on the sensed data, the artificial reality application determines a current pose for the frame of reference of HMD 112 and, in accordance with the current pose, renders the artificial reality content 122.

AR system 100 may trigger generation and rendering of virtual content items based on a current field of view 130 of user 110, as may be determined by real-time gaze tracking of the user, or other conditions. More specifically, image capture devices 138 of HMD 112 capture image data representative of objects in the real-world, physical environment that are within a field of view 130 of image capture devices 138. Field of view 130 typically corresponds with the viewing perspective of HMD 112. In some examples, the artificial reality application presents artificial reality content 122 comprising mixed reality and/or augmented reality. The artificial reality application may render images of real-world objects, such as the portions of a peripheral device, the hand, and/or the arm of the user 110, that are within field of view 130 along with virtual objects 120, such as within artificial reality content 122. In other examples, the artificial reality application may render virtual representations of the portions of a peripheral device, the hand, and/or the arm of the user 110 that are within field of view 130 (e.g., render real-world objects as virtual objects 120) within artificial reality content 122. In either example, user 110 is able to view the portions of their hand, arm, a peripheral device and/or any other real-world objects that are within field of view 130 within artificial reality content 122. In other examples, the artificial reality application may not render representations of the hand or arm of user 110.

To provide virtual content alone, or overlaid with real-world objects in a scene, HMD 112 may include a display system. For example, the display may include a projector and waveguide configured to translate the image output by the projector to a location viewable by a user's eye or eyes. The projector may include a display and a projector lens. The waveguide may include an input grating coupler to redirect light from the projector into the waveguide, and the waveguide may "trap" the light via total internal reflection (TIR). For example, the display may include arrays of red, green, and blue LEDs. In some examples, a color image may be formed by combination of the red, green, and blue light from each of the red, green, and blue LED arrays via a combiner. The waveguide may include an output grating to redirect light out of the waveguide, for example, towards an eyebox. In some examples, the projector lens may collimate light from the display, e.g., the display may be located substantially at a focal point of the projector lens. The grating coupler may redirect the collimated light from the display into the waveguide, and the light may propagate within the waveguide via TIR at the surfaces of the waveguide. The waveguide may include an output structure, e.g., holes, bumps, dots, a holographic optical element (HOE), a diffractive optical element (DOE), etc., to redirect light from the waveguide to a user's eye, which focuses the collimated light from the display of the projector on the user's retina, thereby reconstructing the display image on the user's retina. In some examples, the TIR of the waveguide functions as a mirror and does not significantly affect the image quality of the display, e.g., the user's view of the display is equivalent to viewing the display in a mirror.

As further described herein, one or more devices of artificial reality system 100, such as HMD 112, controllers 114 and/or a console 106, may include one or more SoCs. Further, one of more of the SoCs may comprise an SoC configured to perform distributed phased SRAM repair.

Figure 2A:
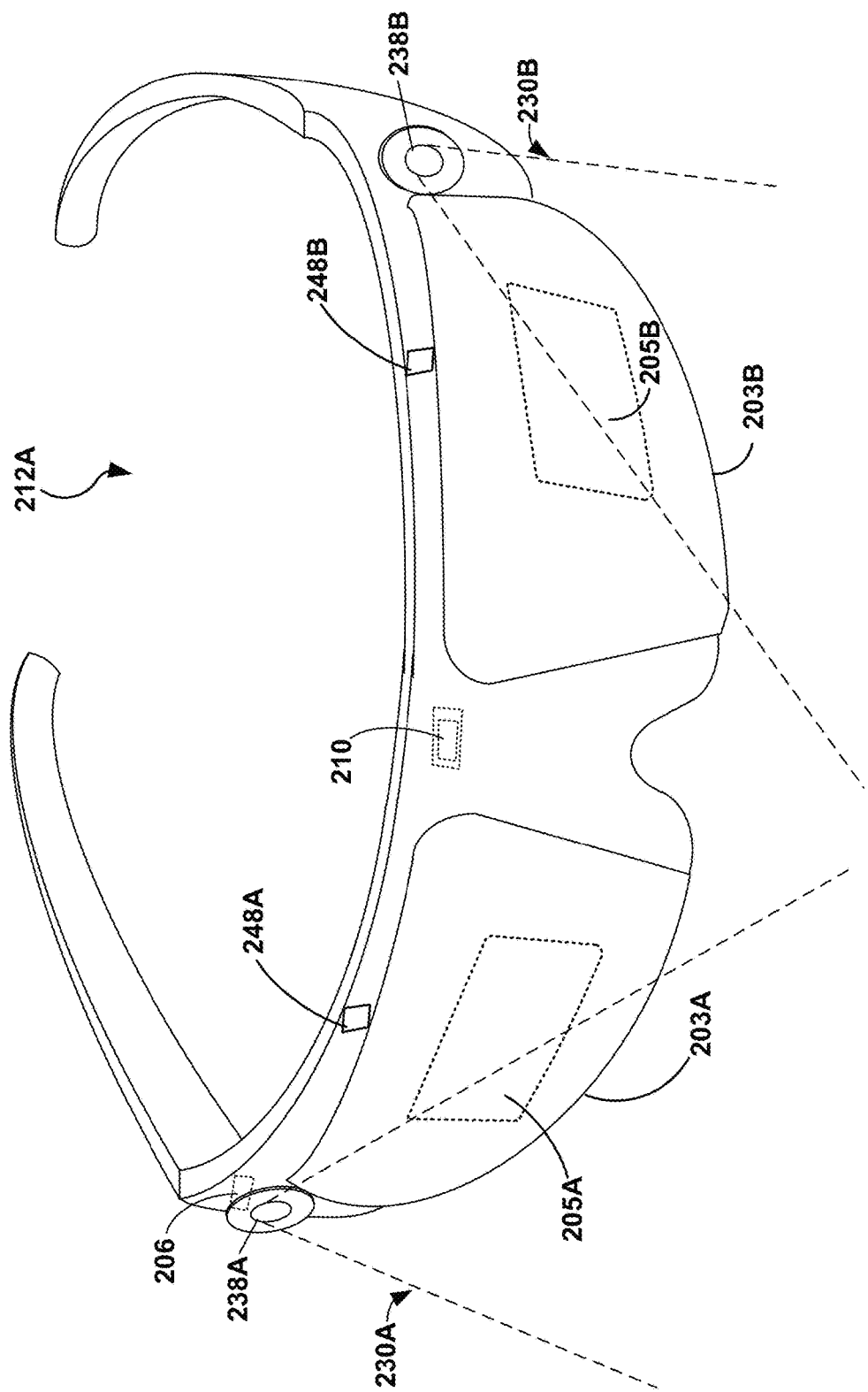
FIG. 2A is an illustration depicting an example HMD that includes an SoC configured to implement distributed phased SRAM repair, in accordance with techniques described in this disclosure.

FIG. 2A is an illustration depicting an example HMD that includes an SoC configured to implement distributed phased SRAM repair, in accordance with techniques described in this disclosure. HMD 212A of FIG. 2A may be an example of HMD 112 of FIG. 1. As shown in FIG. 2A, HMD 212A may take the form of glasses. HMD 212A may be part of an artificial reality system, such as AR system 100 of FIG. 1, or may operate as a stand-alone, mobile artificial realty system configured to implement the techniques described herein.

In this example, HMD 212A are glasses comprising a front frame including a bridge to allow the HMD 212A to rest on a user's nose and temples (or "arms") that extend over the user's ears to secure HMD 212A to the user. In addition, HMD 212A of FIG. 2A includes one or more waveguides 203A and 203B (collectively, "waveguides 203") and one or more waveguide output structures 205A and 205B (collectively, "waveguide output structures 205") configured to redirect light out of the waveguides 203A and 203B. In the example shown, projectors 248A and 248B (collectively, "projectors 248") may input light, e.g., collimated light, into waveguides 203A and 203B via a grating coupler (not shown) that redirects light from the projectors 248 into waveguides 203 such that the light is "trapped" via total internal reflection (TIR) within the waveguide. For example, projectors 248A and 248B may include a display and a projector lens. In some examples, waveguides 203 may be transparent and alternatively may be referred to as "windows 203" hereinafter. In some examples, the known orientation and position of windows 203 relative to the front frame of HMD 212A is used as a frame of reference, also referred to as a local origin, when tracking the position and orientation of HMD 212A for rendering artificial reality content according to a current viewing perspective of HMD 212A and the user. In some examples, projectors 248 can provide a stereoscopic display for providing separate images to each eye of the user.

In the example shown, waveguide output structures 205 cover a portion of the windows 203, subtending a portion of the field of view 230 viewable by a user 110 through the windows 203. In other examples, the waveguide output structures 205 can cover other portions of the windows 203, or the entire area of the windows 203.

As further shown in FIG. 2A, in this example, HMD 212A further includes one or more motion sensors 206, one or more integrated image capture devices 238A and 238B (collectively, "image capture devices 238"), an internal control unit 210, which may include an internal power source and one or more printed-circuit boards having one or more processors, memory, and hardware to provide an operating environment for executing programmable operations to process sensed data and present artificial reality content on waveguide output structures 205. Internal control unit 210 may include an SoC in accordance with the present disclosure that receives information from one or more of sensor(s) 206, image capture devices 238, controller(s) such as controller(s) 114 as shown in FIG. 1, and/or other sensors, and that forms part of a computing system to process the sensed data and present artificial reality content on waveguide output structures 205 in accordance with the present disclosure. In some aspects, the SoC may perform distributed phased SRAM repair for SRAMs of subsystems of the SoC.

Image capture devices 238A and 238B (collectively, "image capture devices 238") may include devices such as video cameras, laser scanners, Doppler radar scanners, depth scanners, or the like, configured to output image data representative of the physical environment. More specifically, image capture devices 238 capture image data representative of objects in the physical environment that are within a field of view 230A, 230B of image capture devices 238, which typically corresponds with the viewing perspective of HMD 212A.

Figure 2B:
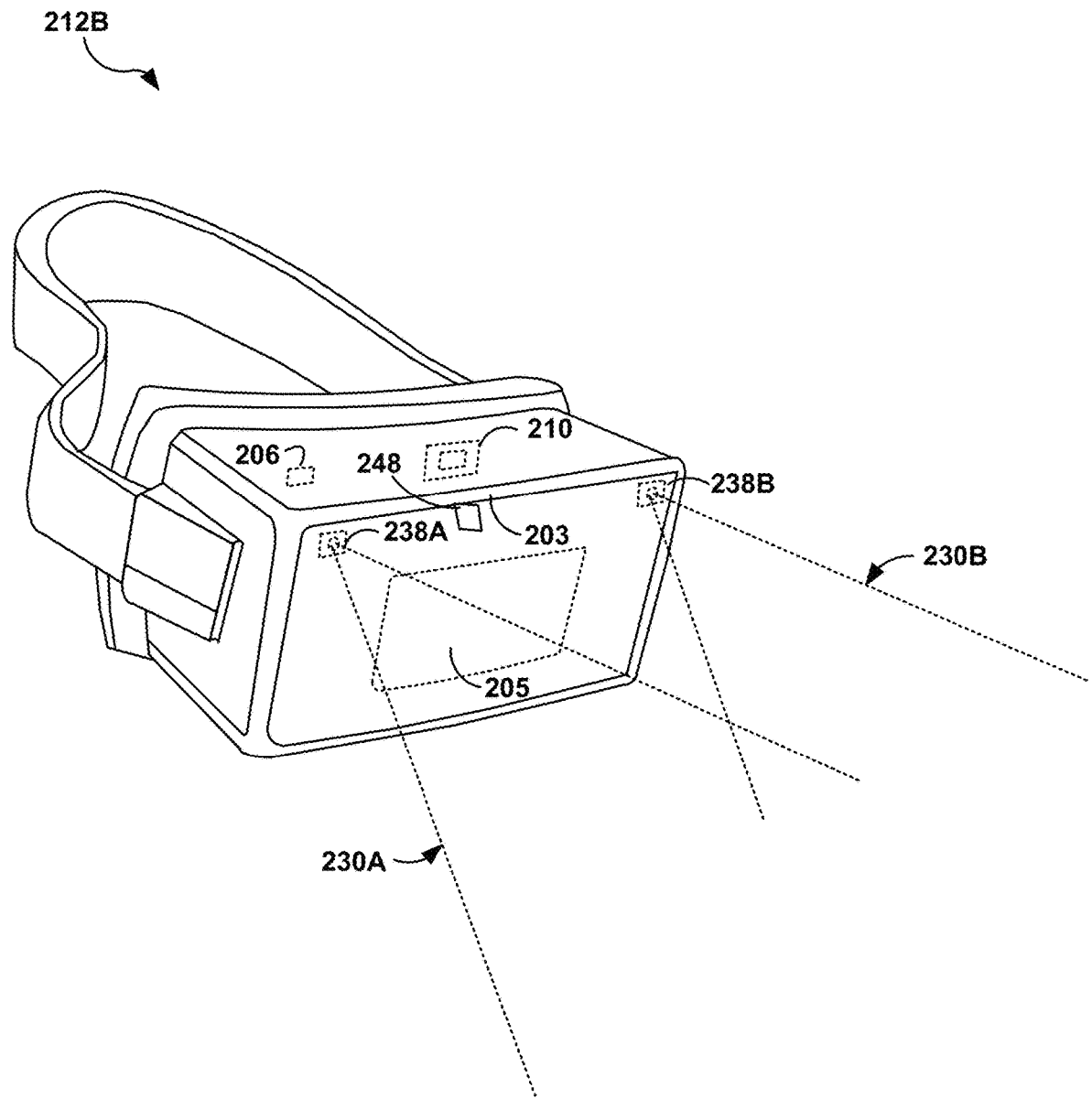
FIG. 2B is an illustration depicting another example HMD that includes an SoC configured to implement distributed phased SRAM repair, in accordance with techniques described in this disclosure.

FIG. 2B is an illustration depicting another example HMD that includes an SoC configured to implement distributed phased SRAM repair, in accordance with techniques described in this disclosure. HMD 212B may be part of an artificial reality system, such as artificial reality system 100 of FIG. 1, or may operate as a stand-alone, mobile artificial realty system configured to implement the techniques described herein.

In this example, HMD 212B includes a front rigid body and a band to secure HMD 212B to a user. In addition, HMD 212B includes a waveguide 203 (or, alternatively, a window 203) configured to present artificial reality content to the user via a waveguide output structure 205. In the example shown, projector 248 may input light, e.g., collimated light, into waveguide 203 via an input grating coupler (not shown) that redirects light from projector(s) 248 into waveguide 203 such that the light is "trapped" via total internal reflection (TIR) within waveguide 203. For example, projector 248 may include a display and a projector lens. In some examples, the known orientation and position of waveguide 203 relative to the front rigid body of HMD 212B is used as a frame of reference, also referred to as a local origin, when tracking the position and orientation of HMD 212B for rendering artificial reality content according to a current viewing perspective of HMD 212B and the user. In other examples, HMD 212B may take the form of other wearable head mounted displays, such as glasses or goggles.

Similar to HMD 212A of FIG. 2A, the example HMD 212B shown in FIG. 2B further includes one or more motion sensors 206, one or more integrated image capture devices 238A and 238B, an internal control unit 210, which may include an internal power source and one or more printed-circuit boards having one or more processors, memory, and hardware to provide an operating environment for executing programmable operations to process sensed data and present artificial reality content on waveguide output structure 205. Internal control unit 210 may include an SoC in accordance with the present disclosure that receives information from one or more of sensor(s) 206, image capture devices 238, controller(s) such as controller(s) 114 as shown in FIG. 1, and/or other sensors, and that forms part of a computing system to process the sensed data and present artificial reality content on waveguide output structures 205 in accordance with the present disclosure. In some aspects, the SoC may perform distributed phased SRAM repair for SRAMS of subsystems of the SoC.

Figure 3:
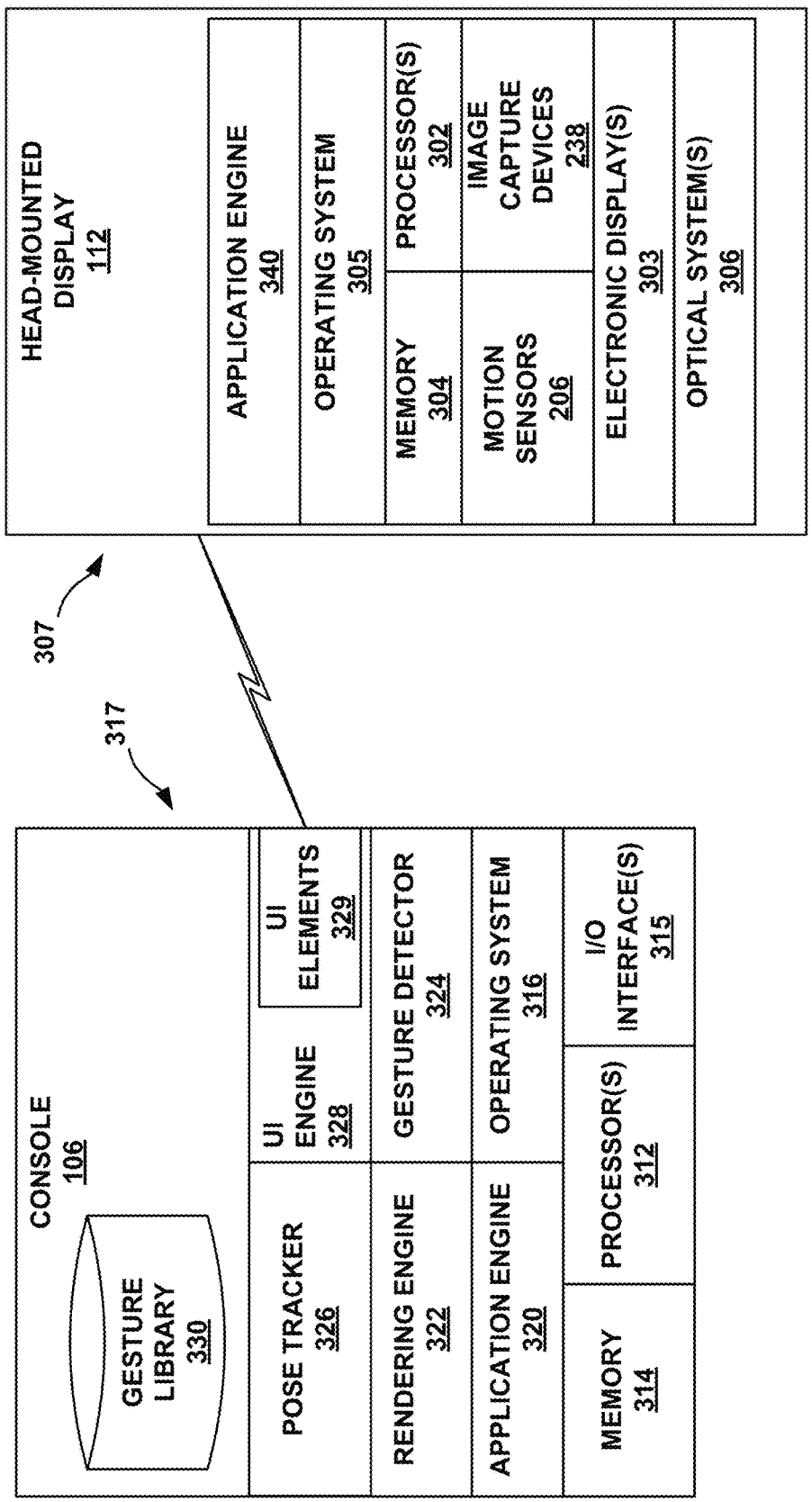
FIG. 3 is a block diagram showing example implementations of a console and an HMD of the artificial reality system of FIG. 1, in accordance with techniques described in this disclosure.

FIG. 3 is a block diagram showing example implementations of a console and an HMD of the artificial reality system of FIG. 1, in accordance with techniques described in this disclosure. In the example of FIG. 3, console 106 performs pose tracking, gesture detection, and user interface generation and rendering for HMD 112 based on sensed data, such as motion data and image data received from HMD 112 and/or external sensors.

In this example, HMD 112 includes one or more processors 302 and memory 304 that, in some examples, provide a computer platform for executing an operating system 305, which may be an embedded, real-time multitasking operating system, for instance, or other type of operating system. In turn, operating system 305 provides a multitasking operating environment for executing one or more software components 307, including application engine 340. As discussed with respect to the examples of FIGS. 2A and 2B, processors 302 are coupled to electronic display 303, motion sensors 206, image capture devices 138, and, in some examples, optical system 306. In some examples, processors 302 and memory 304 may be separate, discrete components. In other examples, memory 304 may be on-chip memory collocated with processors 302 within a single integrated circuit such as an SoC. In some examples, functionality of processors 302 and/or memory 304 for processing data may be implemented as an SoC/SRAM integrated circuit component in accordance with the present disclosure.

In some examples, optical system 306 may include projectors and waveguides for presenting virtual content to a user, as described above with respect to FIGS. 2A and 2B. For example, optical system 306 may include a projector including electronic display 303 and a projection lens.

In general, console 106 is a computing device that processes image and tracking information received from image capture devices 138 to perform gesture detection and user interface and/or virtual content generation for HMD 112. In some examples, console 106 is a single computing device, such as a workstation, a desktop computer, a laptop, or gaming system. In some examples, at least a portion of console 106, such as processors 312 and/or memory 314, may be distributed across a cloud computing system, a data center, or across a network, such as the Internet, another public or private communications network, for instance, broadband, cellular, Wi-Fi, and/or other types of communication networks for transmitting data between computing systems, servers, and computing devices.

In the example of FIG. 3, console 106 includes one or more processors 312 and memory 314 that, in some examples, provide a computer platform for executing an operating system 316, which may be an embedded, real-time multitasking operating system, for instance, or other type of operating system. In turn, operating system 316 provides a multitasking operating environment for executing one or more software components 317. Processors 312 are coupled to one or more I/O interfaces 315, which provides one or more I/O interfaces for communicating with external devices, such as a keyboard, game controller(s), display device(s), image capture device(s), HMD(s), peripheral device(s), and the like. Moreover, the one or more I/O interfaces 315 may include one or more wired or wireless network interface controllers (NICs) for communicating with a network, such as network 104. In some examples, functionality of processors 312 and/or memory 314 for processing data may be implemented as an SoC/SRAM integrated circuit component in accordance with the present disclosure.

Software components 317 of console 106 operate to provide an overall artificial reality application. In this example, software components 317 include application engine 320, rendering engine 322, gesture detector 324, pose tracker 326, and user interface engine 328.

In general, application engine 320 includes functionality to provide and present an artificial reality application, e.g., a teleconference application, a gaming application, a navigation application, an educational application, training or simulation applications, and the like. Application engine 320 may include, for example, one or more software packages, software libraries, hardware drivers, and/or Application Program Interfaces (APIs) for implementing an artificial reality application on console 106. Responsive to control by application engine 320, rendering engine 322 generates 3D artificial reality content for display to the user by application engine 340 of HMD 112.

Application engine 320 and rendering engine 322 construct the artificial content for display to user 110 in accordance with current pose information for a frame of reference, typically a viewing perspective of HMD 112, as determined by pose tracker 326. Based on the current viewing perspective, rendering engine 322 constructs the 3D, artificial reality content which may in some cases be overlaid, at least in part, upon the real-world 3D environment of user 110. During this process, pose tracker 326 operates on sensed data received from HMD 112, such as movement information and user commands, and, in some examples, data from any external sensors 90 (FIG. 1), such as external cameras, to capture 3D information within the real-world environment, such as motion by user 110 and/or feature tracking information with respect to user 110. Based on the sensed data, pose tracker 326 determines a current pose for the frame of reference of HMD 112 and, in accordance with the current pose, constructs the artificial reality content for communication, via the one or more I/O interfaces 315, to HMD 112 for display to user 110.

Pose tracker 326 may determine a current pose for HMD 112 and, in accordance with the current pose, triggers certain functionality associated with any rendered virtual content (e.g., places a virtual content item onto a virtual surface, manipulates a virtual content item, generates and renders one or more virtual markings, generates and renders a laser pointer). In some examples, pose tracker 326 detects whether the HMD 112 is proximate to a physical position corresponding to a virtual surface (e.g., a virtual pinboard), to trigger rendering of virtual content.

User interface engine 328 is configured to generate virtual user interfaces for rendering in an artificial reality environment. User interface engine 328 generates a virtual user interface to include one or more virtual user interface elements 329, such as a virtual drawing interface, a selectable menu (e.g., drop-down menu), virtual buttons, a directional pad, a keyboard, or other user-selectable user interface elements, glyphs, display elements, content, user interface controls, and so forth.

Console 106 may output this virtual user interface and other artificial reality content, via a communication channel, to HMD 112 for display at HMD 112.

Based on the sensed data from any of the image capture devices 138, or other sensor devices, gesture detector 324 analyzes the tracked motions, configurations, positions, and/or orientations of controllers 114 and/or objects (e.g., hands, arms, wrists, fingers, palms, thumbs) of the user 110 to identify one or more gestures performed by user 110. More specifically, gesture detector 324 analyzes objects recognized within image data captured by image capture devices 138 of HMD 112 and/or sensors 90 to identify controller(s) 114 and/or a hand and/or arm of user 110, and track movements of controller(s) 114, hand, and/or arm relative to HMD 112 to identify gestures performed by user 110. In some examples, gesture detector 324 may track movement, including changes to position and orientation, of controller(s) 114, hand, digits, and/or arm based on the captured image data, and compare motion vectors of the objects to one or more entries in gesture library 330 to detect a gesture or combination of gestures performed by user 110. In some examples, gesture detector 324 may receive user inputs detected by presence-sensitive surface(s) of controller(s) 114 and process the user inputs to detect one or more gestures performed by user 110 with respect to controller(s) 114.

Figure 4:
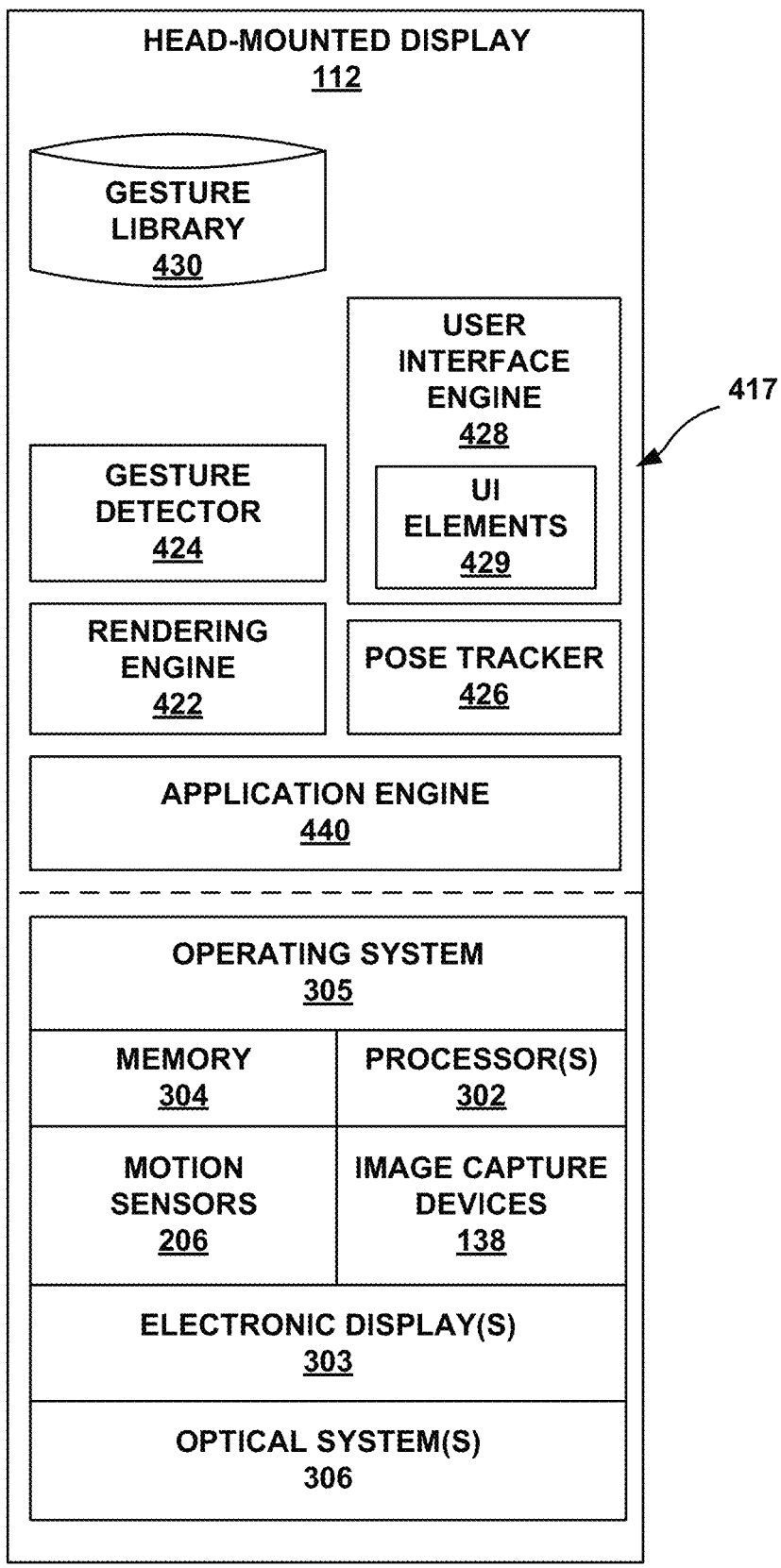
FIG. 4 is a block diagram depicting an example HMD of the artificial reality system of FIG. 1, in accordance with the techniques described in this disclosure.

FIG. 4 is a block diagram depicting an example HMD of the artificial reality system of FIG. 1, in accordance with the techniques described in this disclosure. In the example shown in FIG. 4, HMD 112 is a standalone artificial reality system. In this example, like FIG. 3, HMD 112 includes one or more processors 302 and memory 304 that, in some examples, provide a computer platform for executing an operating system 305, which may be an embedded, real-time multitasking operating system, for instance, or other type of operating system. In turn, operating system 305 provides a multitasking operating environment for executing one or more software components 417. Moreover, processor(s) 302 are coupled to electronic display(s) 303, varifocal optical system(s) 306, motion sensors 206, and image capture devices 138. In some examples, functionality of processors 302 and/or memory 304 for processing data may be implemented as an SoC integrated circuit component in accordance with the present disclosure.

In some examples, optical system 306 may include projectors and waveguides for presenting virtual content to a user, as described above with respect to FIGS. 2A-2B. For example, optical system 306 may include a projector including electronic display 303 and a projection lens. The projection lens may further include a multi-functional DOE that functions as both a grating coupler to redirect light into a waveguide and as a lens element improving the imaging quality of the projector lens.

In the example of FIG. 4, software components 417 operate to provide an overall artificial reality application. In this example, software components 417 include application engine 440, rendering engine 422, gesture detector 424, pose tracker 426, and user interface engine 428. In various examples, software components 417 operate similar to the counterpart components of console 106 of FIG. 3 (e.g., application engine 320, rendering engine 322, gesture detector 324, pose tracker 326, and user interface engine 328) to construct virtual user interfaces overlaid on, or as part of, the artificial content for display to user 110.

Similar to the examples described with respect to FIG. 3, based on the sensed data from any of the image capture devices such as image capture devices 138, 238 or 102, controller(s) 114, and/or other sensor devices, gesture detector 424 analyzes the tracked motions, configurations, positions, and/or orientations of controller(s) 114 and/or objects (e.g., hands, arms, wrists, fingers, palms, thumbs) of the user to identify one or more gestures performed by user 110.

Figure 5:
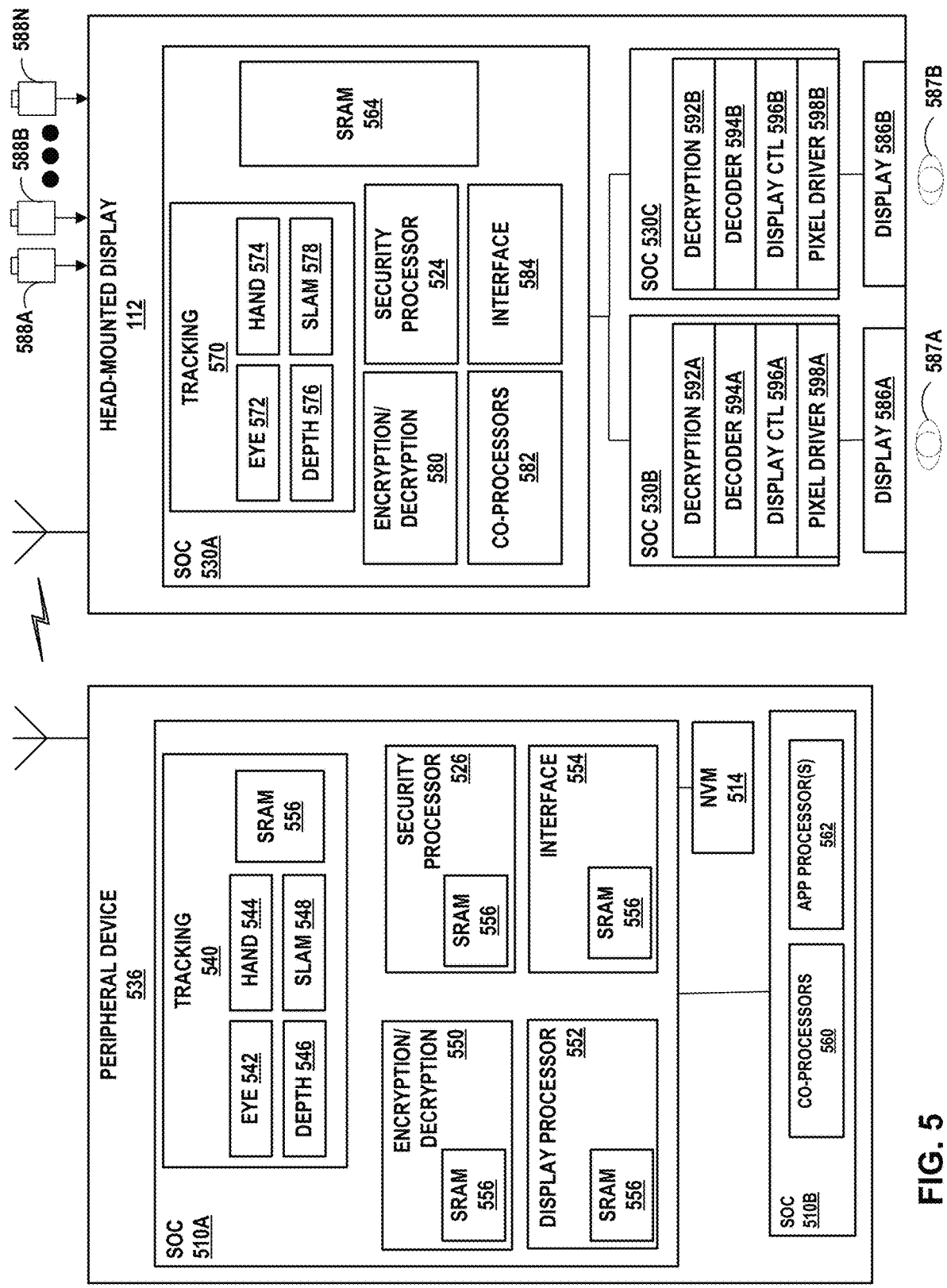
FIG. 5 is a block diagram illustrating an example implementation of a distributed architecture for a multi-device artificial reality system in which one or more devices are implemented using one or more systems-on-a-chip (SoCs) integrated circuits within each device, in accordance with techniques described in this disclosure.

FIG. 5 is a block diagram illustrating an example implementation of a distributed architecture for a multi-device artificial reality system in which one or more devices are implemented using one or more systems-on-a-chip (SoCs) integrated circuits within each device and having wireless communication systems, in accordance with techniques described in this disclosure. FIG. 5 illustrates an example in which HMD 112 operates in conjunction with peripheral device 536. Peripheral device 536 represents a physical, real-world device having a surface on which multi-device artificial reality systems, such as systems 100, overlays virtual content. Peripheral device 536 may include an interface 554 having one or more presence-sensitive surface(s) for detecting user inputs by detecting a presence of one or more objects (e.g., fingers, stylus, etc.) touching or hovering over locations of presence-sensitive surfaces. In some examples, peripheral device 536 may have a form factor similar to any of a smartphone, a tablet computer, a personal digital assistant (PDA), or other hand-held device. In other examples, peripheral device 536 may have the form factor of a smartwatch, a so-called "smart ring," or other wearable device. Peripheral device 536 may also be part of a kiosk or other stationary or mobile system. Interface 554 may incorporate output components, such as one or more display device(s), for outputting visual content to a screen. As described above, HMD 112 is architected and configured to enable the execution of artificial reality applications.

In this example, HMD 112 and peripheral device 536 include SoCs 530A, 510A, respectively, that represent a collection of specialized integrated circuits arranged in a distributed architecture and configured to provide an operating environment for artificial reality applications. As examples, SoC integrated circuits may include specialized functional blocks operating as co-application processors, sensor aggregators, encryption/decryption engines, security processors, hand/eye/depth tracking and pose computation elements, video encoding and rendering engines, display controllers and communication control components. Some or all of these functional blocks may be implemented as subsystems that include SRAM. Further, the SoC may perform distributed phased SRAM repair of the SRAM of some or all such subsystems. FIG. 5 is merely one example arrangement of SoC integrated circuits. The distributed architecture for a multi-device artificial reality system may include any collection and/or arrangement of SoC integrated circuits.

In the example of FIG. 5, HMD 112 includes SoCs 530A, 530B and 530C in accordance with the techniques of the present disclosure. SoC 530A includes SRAM 564. SRAM 564 can be separated or external (e.g., not on-die) from the processor(s) and other on-die circuitry of SoC 530A. Peripheral device 536, in this example, is implemented using a traditional SoC architecture, in which SoC 510A includes an on-die SRAM 556 that may be distributed across subsystems of SoC 510A, and external (off-die) non-volatile local memory 514. In contrast, in accordance with the techniques of the present disclosure, SoC 530A does not include an external non-volatile local memory; instead, SRAM 564 has sufficient memory capacity to perform the functions of both traditional on-die SRAM (such as SRAM 556) and external non-volatile local memory (such as NVM 514).

Head-mounted displays, such as HMD 112 as used in AR/VR systems as described herein, can benefit from the reduction in size, increased processing speed and reduced power consumption provided by the SoC/SRAM 530. For example, the benefits provided by the SoC 530 in accordance with the techniques of the present disclosure can result in increased comfort for the wearer and a more fully immersive and realistic AR/VR experience.

In addition, it shall be understood that any of SoCs 510 and/or 530 may be implemented using an SoC/SRAM integrated circuit component in accordance with the techniques of the present disclosure, and that the disclosure is not limited in this respect. Any of the SoCs 510 and/or 530 may benefit from the reduced size, increased processing speed and reduced power consumption provided by SoC/SRAM integrated circuit described herein. In addition, the benefits provided by the SoC/SRAM component in accordance with the techniques of the present disclosure are not only advantageous for AR/VR systems, but may also be advantageous in many applications such as autonomous driving, edge-based artificial intelligence, Internet-of-Things, and other applications which require highly responsive, real-time decision-making capabilities based on analysis of data from a large number of sensor inputs.

In this example, SoC 530A of HMD 112 comprises functional blocks including security processor 524, tracking 570, an encryption/decryption 580, co-processors 582, and an interface 584. Tracking 570 provides a functional block for eye tracking 572 ("eye 572"), hand tracking 574 ("hand 574"), depth tracking 576 ("depth 576"), and/or Simultaneous Localization and Mapping (SLAM) 578 ("SLAM 578"). Some or all these functional blocks may be implemented within one or more subsystems of SoC 530A. As an example of the operation of these functional blocks, HMD 112 may receive input from one or more accelerometers (also referred to as inertial measurement units or "IMUs") that output data indicative of current acceleration of HMD 112, GPS sensors that output data indicative of a location of HMD 112, radar or sonar that output data indicative of distances of HMD 112 from various objects, or other sensors that provide indications of a location or orientation of HMD 112 or other objects within a physical environment. HMD 112 may also receive image data from one or more image capture devices 588A-588N (collectively, "image capture devices 588"). Image capture devices may include video cameras, laser scanners, Doppler radar scanners, depth scanners, or the like, configured to output image data representative of the physical environment. More specifically, image capture devices capture image data representative of objects (including peripheral device 536 and/or hand) in the physical environment that are within a field of view of image capture devices, which typically corresponds with the viewing perspective of HMD 112. Based on the sensed data and/or image data, tracking 570 determines, for example, a current pose for the frame of reference of HMD 112 and, in accordance with the current pose, renders the artificial reality content.

Encryption/decryption 580 of SoC 530A is a functional block to encrypt outgoing data communicated to peripheral device 536 or a security server and decrypt incoming data communicated from peripheral device 536 or a security server. Coprocessors 582 include one or more processors for executing instructions, such as a video processing unit, graphics processing unit, digital signal processors, encoders and/or decoders, AR/VR applications and/or others.

Interface 584 of SoC 530A is a functional block that includes one or more interfaces for connecting to functional blocks of SoC 530B and/or 530C. As one example, interface 584 may include peripheral component interconnect express (PCIe) slots. SoC 530A may connect with SoC 530B, 530C using interface 584. SoC 530A may connect with a communication device (e.g., radio transmitter) using interface 584 for communicating with other devices, e.g., peripheral device 536.

SoCs 530B and 530C of HMD 112 each represents display controllers for outputting artificial reality content on respective displays, e.g., displays 586A, 586B (collectively, "displays 586"). In this example, SoC 530B may include a display controller for display 586A to output artificial reality content for a left eye 587A of a user. For example, SoC 530B includes a decryption block 592A, decoder block 594A, display controller 596A, and/or a pixel driver 598A for outputting artificial reality content on display 586A. Similarly, SoC 530C may include a display controller for display 586B to output artificial reality content for a right eye 587B of the user. For example, SoC 530C includes decryption 592B, decoder 594B, display controller 596B, and/or a pixel driver 598B for generating and outputting artificial reality content on display 586B. Displays 568 may include Light-Emitting Diode (LED) displays, Organic LEDs (OLEDs), Quantum dot LEDs (QLEDs), Electronic paper (E-ink) displays, Liquid Crystal Displays (LCDs), or other types of displays for displaying AR content.

In this example, peripheral device 536 includes SoCs 510A and 510B configured to support an artificial reality application. In this example, SoC 510A comprises functional blocks including security processor 226, tracking 540, an encryption/decryption 550, a display processor 552, and an interface 554. Tracking 540 is a functional block providing eye tracking 542 ("eye 542"), hand tracking 544 ("hand 544"), depth tracking 546 ("depth 546"), and/or Simultaneous Localization and Mapping (SLAM) 548 ("SLAM 548"). Some or all of these functional blocks may be implemented in various subsystems of SoC 510A. As an example of the operation of SoC 510A, peripheral device 536 may receive input from one or more accelerometers (also referred to as inertial measurement units or "IMUs") that output data indicative of current acceleration of peripheral device 536, GPS sensors that output data indicative of a location of peripheral device 536, radar or sonar that output data indicative of distances of peripheral device 536 from various objects, or other sensors that provide indications of a location or orientation of peripheral device 536 or other objects within a physical environment. Peripheral device 536 may in some examples also receive image data from one or more image capture devices, such as video cameras, laser scanners, Doppler radar scanners, depth scanners, or the like, configured to output image data representative of the physical environment. Based on the sensed data and/or image data, tracking block 540 determines, for example, a current pose for the frame of reference of peripheral device 536 and, in accordance with the current pose, renders the artificial reality content to HMD 112.

Encryption/decryption 550 of SoC 510A encrypts outgoing data communicated to HMD 112 or security server and decrypts incoming data communicated from HMD 112 or security server. Encryption/decryption 550 may support symmetric key cryptography to encrypt/decrypt data using a session key (e.g., secret symmetric key). Display processor 552 of SoC 510A includes one or more processors such as a video processing unit, graphics processing unit, encoders and/or decoders, and/or others, for rendering artificial reality content to HMD 112. Interface 554 of SoC 510A includes one or more interfaces for connecting to functional blocks of SoC 510A. As one example, interface 584 may include peripheral component interconnect express (PCIe) slots. SoC 510A may connect with SoC 510B using interface 584. SoC 510A may connect with one or more communication devices (e.g., radio transmitter) using interface 584 for communicating with other devices, e.g., HMD 112.

SoC 510B of peripheral device 536 includes co-application processors 560 and application processors 562. In this example, co-processors 560 include various processors, such as a vision processing unit (VPU), a graphics processing unit (GPU), and/or central processing unit (CPU). Application processors 562 may execute one or more artificial reality applications to, for instance, generate and render artificial reality content and/or to detect and interpret gestures performed by a user with respect to peripheral device 536.

Figure 6:
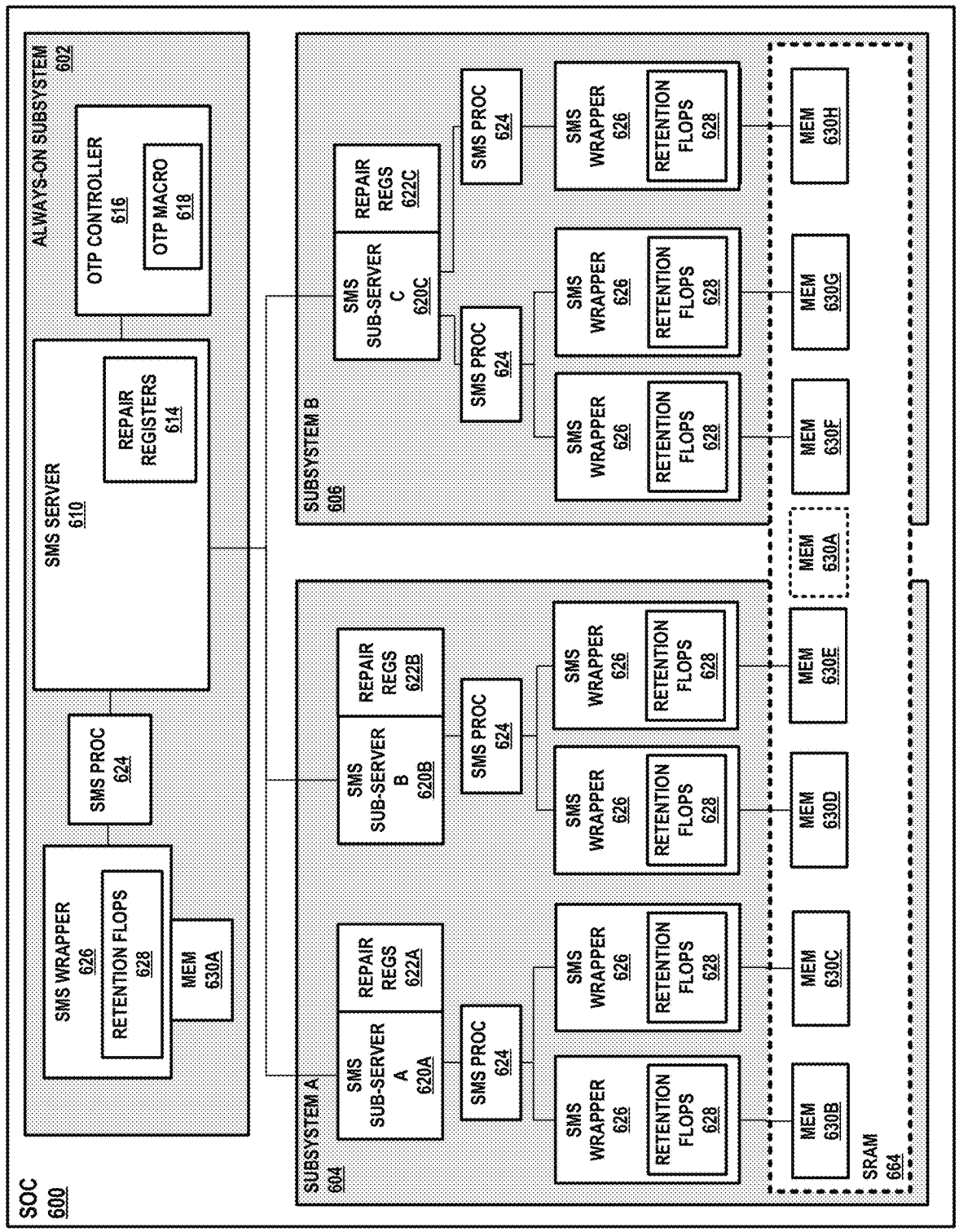
FIG. 6 is a block diagram illustrating an example SoC that implements distributed phased SRAM repair, in accordance with techniques described in this disclosure.

FIG. 6 is a block diagram illustrating an example SoC that implements distributed phased SRAM repair, in accordance with techniques described in this disclosure. As shown in FIG. 6, SoC 600 can include System Micro-Controller Unit (SMCU) 608, always-on subsystem 602, subsystem A 604 and subsystem B 606. SMCU 608 can orchestrate various operations on SoC 600. For example, SMCU 606 can orchestrate firmware loading, boot processing, debugging subsystems, etc. Additionally, SMCU 606 can orchestrate SRAM repair operations on subsystems on SOC 600, including subsystem A 604 and subsystem B 606. The SRAM repair operations can be distributed across the subsystems of SOC 600 as described herein. Additionally, SRAM repair operations can occur in phases that correspond to activation of subsystems of an SOC as described herein.

In some aspects, always-on subsystem 602 can be a relatively small low power and low latency subsystem that remains powered for as long as power is supplied to SOC 600. In some aspects, always-on subsystem 602 can provide functions such as secure boot, power management, sensor hub, basic monitoring and housekeeping among others. Always-on subsystem 602 can wake up other subsystems (e.g., subsystem A 604 and subsystem B 606) as such subsystems are needed. As an example, during a first phase of SoC operation, always-on subsystem 602 may be activated after boot or reset of the SoC. Subsystems A 604 and B 606 may be inactive and may not be powered until needed. As examples, subsystem A 604 may be an application processing subsystem of SoC 600 that executes an application such as an AR/VR application and subsystem B 606 may be a video subsystem that may be used by other subsystems on-demand. Always-on subsystem 602 can wake up application processing subsystem A 604 in response to an indication that an application is to be executed by processing circuitry of subsystem A 604, thus beginning a second phase of the operation of SoC 600. Video subsystem B 606 may remain unpowered at the time subsystem A 604 is woken. Later, an application may require video input. In response, always-on subsystem B 606 can wake up video subsystem B 606 to facilitate subsystem B 606 supplying video data to the application executing on subsystem A 604, thus beginning a third phase of the operation of SoC 600. Other subsystems not shown in FIG. 6 can include audio subsystems, communications subsystems, navigation subsystems, etc. Such subsystems can be activated at later phases of the operation of SoC 600.

In some aspects, SoC 600 incorporates a Self-Test And Repair (STAR) memory system referred to as SMS. The subsystems 602, 604 and 606 each can include components of SMS. In some aspects, always-on subsystem 602 includes an SMS server 610, One Time Programmable (OTP) macro 618, OTP controller 616, SMS processor 624, and memories 630A-630H (referred to collectively as "memories 630" and generically as "memory 630"). Memories 630 may be one or more memory instances of SRAM 664. OTP controller 616 controls access to OTP macro 618. For example, OTP controller 616 may control OTP macro 618 such that it only written once. Further, OTP controller 616 may restrict access to OTP macro 618 to authorized processes or subsystems. OTP macro 618 is non-volatile and thus retains it settings even when power is removed from the SoC.

In the example illustrated in FIG. 6, each of subsystems 602, 604 and 606 have at least one memory 630. Memory 630 can be SRAM. The various subsystems of SoC 600 may have memories 630 where certain bits may have failed or are otherwise unreliable. In some aspects, each memory 630 has associated retention flops 628 that can be used as replacement bits for the failed bits in memory 630. For example, memory 630 may have memory cells where each memory cell has circuitry to implement a bit. In the case of a failure of the bit, a retention flop of retention flops 628 can be associated with bit and used in place of the bit.

SMS server 610, SMS sub-servers 620, SMS processors 624 and SMS wrappers 626 can cooperate to perform a memory built-in self-test (MBIST) for each memory 630 in subsystems 602, 604 and 606 to determine which, if any, bits in their corresponding memories 630 have failed or are unreliable. SMS server 620 can initiate MBIST for memories 630 on SOC 600. For example, SMS server 610 can initiate MBIST for memory 630A and signal SMS sub-servers 620A, 620B and 620C to initiate MBIST on their respective memories 630B-630H. SMS sub-servers 620 signal SMS processors 624 to execute test logic to test their respective memories 630.

The memories 630 of each subsystem have an associated SMS wrapper 626 (also referred to as an "Intelligent Wrapper" (IW)). SMS wrapper 626 presents an interface to SMS processor 624 that is the same regardless of the type of memory being tested. SMS wrapper 626 includes logic to respond to requests from SMS processor 624 to test its associated memory 630. An SMS processor 624 issues test commands to SMS wrapper 626, which has logic to implement the test command that may be specific to the type of memory 630 associated with the wrapper. SMS processor 624 can report any identified failed bits identified by the tests to its associated SMS server 610 or SMS sub-server 620. SMS sub-servers 620 forward the reports of identified failed bits to SMS server 610. SMS server 610 can create a repair signature indicating how repair bits of a memory 630 are to replace the identified failed bits for memories 630. The repair signature can be stored in OTP macro 618, and is thus stored even when power is removed from SoC 600. In some aspects, there can be a repair signature for each SRAM macro or block.

Various repair operations may be performed when SoC is powered, booted, and or reset. Such operations can include retrieving the repair signature, forwarding the repair signature to a SMS sub-server, and the actual repair of a memory 630 by a subsystem, among other operations. For example, upon power-on or boot of SoC 600, SMS server 610 can retrieve the repair signature from OTP macro 618 and can store the repair signature for memory 630A in repair registers 614. SMS server 610 can use the repair signature to replace the failed bits in memories 630A with their corresponding retention flops 628 for always-on subsystem 602. In response to an activation event, SMS server 610 can communicate the repair signatures for some or all of memories 630B-630H to their corresponding sub-servers 620 for storage in repair registers 622. An activation event can be a power-on event (e.g., rail gate event, on-die power gating event, etc.), reset event, boot event, wake event etc. and can occur after SoC 600 has been booted. An activation event can reoccur while the SoC is powered on and operational. Such an event may be referred to as a reactivation event. Using the example of an application subsystem and a video subsystem, an application may initiate execution on the application subsystem. The application, at some point during its execution, may need video input and thus causes the video subsystem to be initially activated. Later, the application may no longer need the video input, and thus the video subsystem may be deactivated, e.g., powered down to save power while one or more other subsystems remain active. Later still, the application may again need video input and reactivate the video subsystem. This subsequent activation may be referred to as a reactivation event.

An activation event can be specific to a particular subsystem or subsystems and need not include all of the subsystems on SoC 600. For example, subsystem 604 may have an activation event at a particular time while subsystem 606 may not. Thus, subsystem activation and associated SRAM repair operations can occur in different phases of the operation of SoC 600. Using the example discussed above where subsystem A 604 is an application processing subsystem and subsystem B is a video processing subsystem, a first phase of SRAM repair occurs when SoC 600 is booted or reset, and always-on subsystem repairs memory 630A. A second phase of SRAM repair occurs when the application processing subsystem (subsystem A 604 in this example) repairs memories 630B-630E. A third phase of SRAM repair occurs when the video processing subsystem (subsystem B 606 in this example) is activated and repairs memories 630F-630H.

SoC 600 can perform memory repair operations in a distributed manner. For example, always-on subsystem 602 can repair memory 630A. Subsystem A 604 can repair memories 630B-630E and subsystem B 606 can repair memories 630F-630H. Other subsystems (not shown in FIG. 6) can repair their respective memories. The repair operations of SRAM 664 can thus be distributed across some or all of the subsystems of SoC 600. The repair operations can take place in parallel. For example, two or more subsystems may be activated at the same time. SMS sub-servers on the respective subsystems can perform memory repair operations for their respective memories in parallel with one another.

Sub-servers 620 can use the repair signatures stored in their respective repair registers 622 to set retention flops 628 that replace the failed bits in their respective memories 630. The retention flops 628 can remain associated with (i.e., replace) their corresponding failed bits until power is no longer supplied to the flop.

Each of subsystems 602, 604 and 606 may be in different power domains. A power domain may be specified in the hardware of the SoC based on pre-silicon designation of the power domain. As an example, always-on subsystem 602 may be in an always-on power domain that receives power for as long as SoC 600 receives power, subsystems A 604 and B 606 may each be in different power domains than always-on power domain 602 and from each other. Additionally, different components of a sub-system may be in different power domains. Power may be applied to different power domains at different times.

Figure 7:
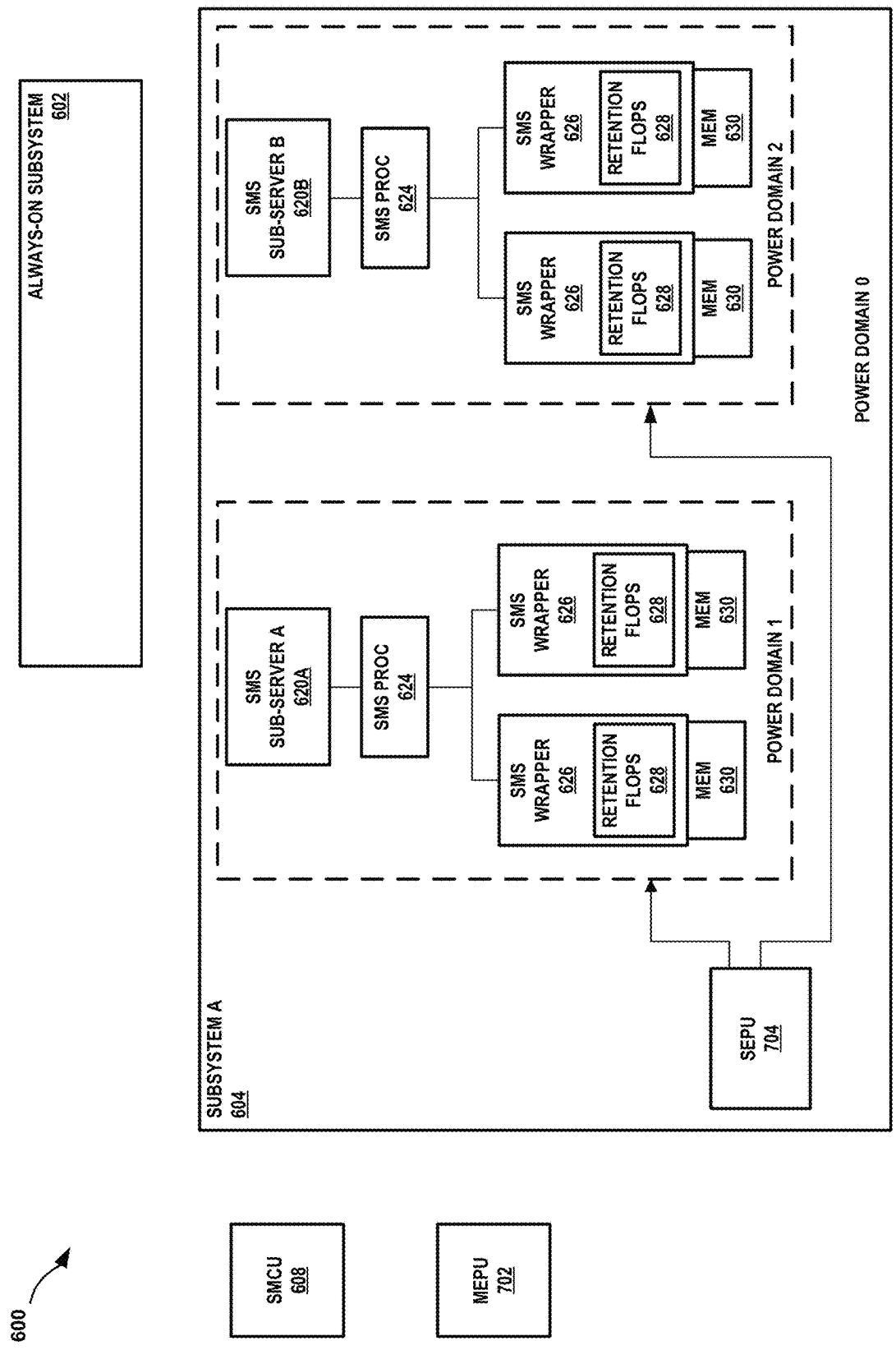
FIG. 7 is a block diagram illustrating power domains for an example SoC, in accordance with techniques described in this disclosure.

FIG. 7 is a block diagram illustrating power domains for example SoC subsystem, in accordance with techniques described in this disclosure. The example illustrated in FIG. 7 continues the example shown in FIG. 6 with respect to example power domains. In this example SoC 600 includes a main energy processing unit (MEPU) 702. Main energy processing unit includes processing circuitry and logic that controls whether and how power is supplied to components of SoC 600. For example, in some aspects, MEPU 702 may control how power is suppled to always-on subsystem 602 and the other subsystems of SoC 600 (e.g., subsystems 604 and 606). In some aspects, a subsystem may be rail gated.

Subsystem A 604 includes a subsystem energy processing unit (SEPU) 704. SEPU 704 may control whether and how power is supplied to components within a subsystem. As shown in FIG. 7, SEPU 704 controls power for subsystem A 604. Always-on subsystem 602 and other subsystems of SoC 600 may have their own respective SEPUs.

In the example shown in FIG. 7, subsystem A 604 has three power domains 0-2 Power domain 0 comprises the entire subsystem. Power domain 1 and power domain 2 comprise SMS sub-servers 620A and 720B respectively along with their associated SMS processors 624, SMS wrappers 626 and memories 630. When power is applied to subsystem A as determined by MEPU gating or rail gating, SEPU 704 can determine how power is to be applied to domains within subsystem A 604.

Figure 8:
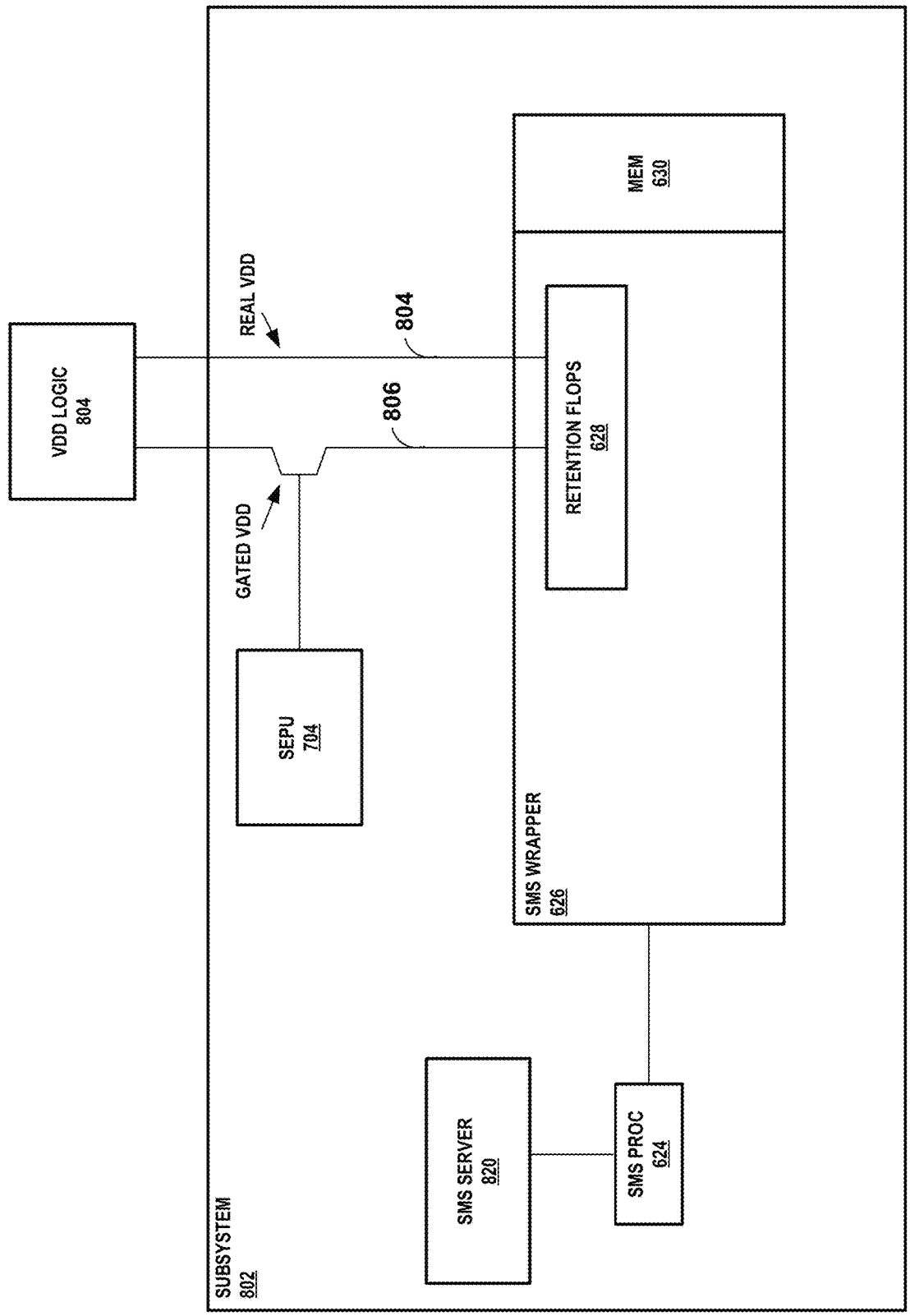
FIG. 8 is a block diagram illustrating power supply for retention flops, in accordance with techniques described in this disclosure.

FIG. 8 is a block diagram illustrating power applied to retention flops, in accordance with techniques described in this disclosure. Subsystem 802 in FIG. 8 may be any of always-on subsystem 602, subsystem A 604, or subsystem B 606 of FIG. 6 or other subsystems of SoC 600. SMS server 820 may be either an SMS server such as SMS server 610 or an SMS sub-server such as SMS sub-server 620 of FIG. 6. As noted above, a retention flop may lose its state when the flop loses power. For example, power to a subsystem that is no longer needed may be removed in order to lower the power consumption of the SoC, thereby increasing battery life. For example, power may be removed from a video subsystem when an application is finished using a camera on a device. However, if power is removed from a subsystem, retention flops 628 lose their state and memories 630 on the subsystem must be re-repaired if the subsystem is reactivated. This can increase the time necessary for reactivating the subsystem. In some aspects, when power is removed from a subsystem, components other than retention flops 628 are no longer powered. For example, SEPU 704 may remove power from SMS server 820, SMS processor 624, SMS wrapper 626 and memory 630. In some aspects SEPU 704 maintains power for retention flops 628. In the example illustrated in FIG. 8, VDD logic 804 provides power to subsystem 802. In some aspects, when subsystem 802 is activated, VDD logic 804 supplies power to components of subsystem 802 via a "real VDD" line 804. When subsystem 802 is deactivated, VDD logic 804 may no longer supply power via real VDD 804. VDD logic 804 may supply power to SEPU 704, which can gate power to retention flops 628 via gated VDD 806 to maintain the state of retention flops 628. When subsystem 802 is reactivated, VDD logic 804 may again supply power to subsystem components via real VDD 804. Thus, should subsystem 802 be reactivated, retention flops 628 will still be able to be used as a replacement for failed bits of memory 628, and the memory repair process can be bypassed (e.g., not repeated). Thus, power requirements of SoC 600 can be reduced while maintaining low latency activation of subsystems.

Figure 9:
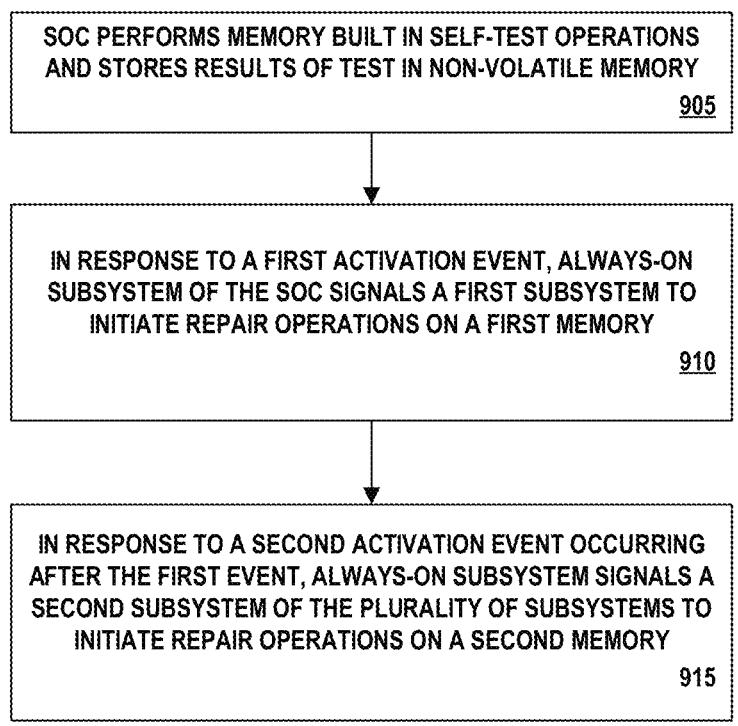
FIG. 9 is a flowchart illustrating example operations of a method for repairing memory in accordance with techniques described in this disclosure.

FIG. 9 is a flowchart illustrating example operations of a method for distributed SRAM repair, in accordance with techniques described in this disclosure. In some examples, an SoC may perform a MBIST and store the repair signature in a non-volatile memory (910). In some examples, an SoC may, in response to a first activation event, signal, by an always-on subsystem of a plurality of subsystems, a first subsystem of the plurality of subsystems to initiate repair operations on a first memory (910). Moreover, an SoC may, in response to a second activation event occurring after the first event, signal, by the always-on subsystem, a second subsystem of the plurality of subsystems to initiate repair operations on a second memory (915).

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components or integrated within common or separate hardware or software components.

The techniques described in this disclosure may also be embodied or encoded in a computer-readable medium, such as a computer-readable storage medium, containing instructions. Instructions embedded or encoded in a computer-readable storage medium may cause a programmable processor, or other processor, to perform the method, e.g., when the instructions are executed. Computer readable storage media may include random access memory (RAM), read only memory (ROM), programmable read only memory (PROM), erasable programmable read only memory (EPROM), electronically erasable programmable read only memory (EEPROM), flash memory, a hard disk, a CD-ROM, a floppy disk, a cassette, magnetic media, optical media, or other computer readable media.

As described by way of various examples herein, the techniques of the disclosure may include or be implemented in conjunction with an artificial reality system. As described, artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured content (e.g., real-world photographs). The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may be associated with applications, products, accessories, services, or some combination thereof, that are, e.g., used to create content in an artificial reality and/or used in (e.g., perform activities in) an artificial reality. The artificial reality system that provides the artificial reality content may be implemented on various platforms, including a head-mounted device (HMD) connected to a host computer system, a standalone HMD, a mobile device or computing system, or any other hardware platform capable of providing artificial reality content to one or more viewers.

What is claimed is:

1. A system on a chip (SoC) comprising:
a first subsystem comprising a first memory;
a second subsystem comprising a second memory; and
an always-on subsystem, the always-on subsystem comprising processing circuitry configured to:
in response to a first activation event, signal the first subsystem to initiate repair operations on the first memory, and
in response to a second activation event occurring after the first event, signal the second subsystem to initiate repair operations on the second memory,
wherein at least one of:
the always-on subsystem further comprises a System Test and Repair (STAR) memory system (SMS) server configured to retrieve, in response to activation of the first subsystem, a repair signature for the first memory and transmit the repair signature to a SMS sub-server of the first subsystem, wherein the SMS sub-server initiates repair operations for the first memory; or
the first memory comprises a subsystem energy processing unit (SEPU) configured to maintain power to a retention flop after power has been removed from the first subsystem, wherein a bit to which the retention flop corresponds is unpowered after power is removed from the first subsystem.

2. The SoC of claim 1, wherein in response to a reactivation event for the first subsystem that occurs after deactivation of the first subsystem, the first subsystem bypasses memory repair operations.

3. The SoC of claim 1, further comprising a System Test and Repair (STAR) memory system (SMS), wherein the always-on subsystem comprises the SMS server configured to:
in response to activation of the first subsystem, retrieve the repair signature for the first memory; and
transmit the repair signature to a SMS sub-server of the first subsystem, wherein the SMS sub-server initiates repair operations for the first memory.

4. The SoC of claim 1, wherein the first memory comprises a memory cell having the bit and the corresponding retention flop, wherein the first subsystem comprises the subsystem energy processing unit (SEPU) configured to:
in response to detection that power is to be removed from the first subsystem, continue to maintain power to the retention flop after power has been removed from the first subsystem, wherein the bit is unpowered after power is removed from the first subsystem.

5. The SoC of claim 1, further comprising:
a main energy processing unit (MEPU) configured to control power for the first subsystem;
an always-on power domain comprising the always-on subsystem;
a first power domain comprising the first subsystem; and
a second power domain comprising the second subsystem,
wherein after boot of the SoC and prior to the first activation event, the MEPU is configured to apply power to the always-on subsystem and not apply power to the first subsystem and the second subsystem.

6. The SoC of claim 5, wherein the MEPU is configured to apply power to the first subsystem in response to the first activation event and wherein the second subsystem remains unpowered prior to the second activation event.

7. The SoC of claim 1, wherein the first memory comprises Static Random-Access Memory (SRAM).

8. An artificial reality system comprising:
a head mounted display (HMD) configured to output artificial reality content, the HMD including at least one system on a chip (SoC), wherein the at least one SoC comprises:
a first subsystem comprising a first memory;
a second subsystem comprising a second memory; and
an always-on subsystem, the always-on subsystem comprising processing circuitry configured to:
in response to a first activation event, signal the first subsystem to initiate repair operations on the first memory, and
in response to a second activation event occurring after the first event, signal the second subsystem to initiate repair operations on the second memory,
wherein at least one of:
the always-on subsystem further comprises a System Test and Repair (STAR) memory system (SMS) server configured to retrieve, in response to activation of the first subsystem, a repair signature for the first memory and transmit the repair signature to a SMS sub-server of the first subsystem, wherein the SMS sub-server initiates repair operations for the first memory; or
the first memory comprises a subsystem energy processing unit (SEPU) configured to maintain power to a retention flop after power has been removed from the first subsystem, wherein a bit to which the retention flop corresponds is unpowered after power is removed from the first subsystem.

9. The artificial reality system of claim 8, wherein in response to a reactivation event for the first subsystem that occurs after deactivation of the first subsystem, the first subsystem bypasses memory repair operations.

10. The artificial reality system of claim 8, wherein the SoC further comprises a System Test and Repair (STAR) memory system (SMS), wherein the always-on subsystem comprises the SMS server configured to:
in response to activation of the first subsystem, retrieve the repair signature for the first memory; and
transmit the repair signature to the SMS sub-server of the first subsystem, wherein the SMS sub-server initiates repair operations for the first memory.

11. The artificial reality system of claim 8, wherein the first memory comprises a memory cell having the bit and the corresponding retention flop, wherein the first subsystem comprises the subsystem energy processing unit (SEPU) configured to:
in response to detection that power is to be removed from the first subsystem, continue to maintain power to the retention flop after power has been removed from the first subsystem, wherein the bit is unpowered after power is removed from the first subsystem.

12. The artificial reality system of claim 8, wherein the SoC further comprises:
a main energy processing unit (MEPU) configured to control power for the first subsystem;
an always-on power domain comprising the always-on subsystem;
a first power domain comprising the first subsystem; and
a second power domain comprising the second subsystem,
wherein after boot of the SoC and prior to the first activation event, the MEPU is configured to apply power to the always-on subsystem and not apply power to the first subsystem and the second subsystem.

13. The artificial reality system of claim 12, wherein the MEPU is configured to apply power to the first subsystem in response to the first activation event and wherein the second subsystem remains unpowered prior to the second activation event.

14. The artificial reality system of claim 8, wherein the first memory comprises Static Random-Access Memory (SRAM).

15. A method repairing memory on an SoC having a plurality of subsystems, the method comprising:
in response to a first activation event, signaling, by an always-on subsystem of the plurality of subsystems, a first subsystem of the plurality of subsystems to initiate repair operations on a first memory;
in response to a second activation event occurring after the first event, signaling, by the always-on subsystem, a second subsystem of the plurality of subsystems to initiate repair operations on a second memory; and
at least one of:
in response to activation of the first subsystem, retrieving, by a System Test and Repair (STAR) memory system (SMS) server of the always-on subsystem, a repair signature for the first memory and transmitting, by the SMS server, the repair signature to an SMS sub-server of the first subsystem, wherein the SMS sub-server initiates repair operations for the first memory; or in response to detection that power is to be removed from the first subsystem, maintaining power to a retention flop after power has been removed from the first subsystem, wherein a bit to which the retention flop corresponds is unpowered after power is removed from the first subsystem.

16. The method of claim 15, wherein in response to a reactivation event for the first subsystem that occurs after deactivation of the first subsystem, bypassing, by the first subsystem, memory repair operations.

17. The method of claim 15, wherein the SoC includes a System Test and Repair (STAR) memory system (SMS), wherein the method comprises:
in response to activation of the first subsystem, retrieving, by the SMS server of the always-on subsystem, the repair signature for the first memory; and
transmitting, by the SMS server, the repair signature to the SMS sub-server of the first subsystem, wherein the SMS sub-server initiates repair operations for the first memory.

18. The method of claim 15, wherein the first memory comprises a memory cell having the bit and the corresponding retention flop, wherein the method comprises:
in response to detection that power is to be removed from the first subsystem, maintaining power to the retention flop after power has been removed from the first subsystem, wherein the bit is unpowered after power is removed from the first subsystem.

19. The method of claim 15, wherein the SoC is configured with a first power domain comprising the first subsystem and a second power domain comprising the second subsystem, wherein the method further comprises:
after boot of the SoC and prior to the first activation event, applying power to the always-on subsystem and not applying power to the first power domain and the second power domain.

20. The method of claim 19, wherein the method further comprises:
applying power to the first power domain in response to the first activation event, wherein the second power domain remains unpowered prior to the second activation event.

* * * * *